(12) United States Patent
Fuhrmann et al.

(10) Patent No.: US 10,103,289 B2
(45) Date of Patent: Oct. 16, 2018

(54) LIGHT-EMITTING DIODE

(71) Applicant: AZUR SPACE Solar Power GmbH, Heilbronn (DE)

(72) Inventors: Daniel Fuhrmann, Heilbronn (DE); Thomas Lauermann, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/606,566

(22) Filed: May 26, 2017

(65) Prior Publication Data
US 2017/0345970 A1    Nov. 30, 2017

(30) Foreign Application Priority Data
May 27, 2016  (DE) .................. 10 2016 006 295

(51) Int. Cl.
  *H01L 29/06*      (2006.01)
  *H01L 31/00*      (2006.01)
  *H01L 33/14*      (2010.01)
  *H01L 33/00*      (2010.01)
  *H01L 33/06*      (2010.01)
  (Continued)

(52) U.S. Cl.
  CPC .......... *H01L 33/14* (2013.01); *H01L 33/0033* (2013.01); *H01L 33/04* (2013.01); *H01L 33/06* (2013.01); *H01L 33/08* (2013.01); *H01L 33/30* (2013.01); *H01L 33/305* (2013.01); *H01L 33/405* (2013.01); *H01L 33/62* (2013.01); *H01L 33/02* (2013.01)

(58) Field of Classification Search
  CPC ....................................... H01L 33/14

USPC ........................................... 257/13
See application file for complete search history.

(56) References Cited

U.S. PATENT DOCUMENTS 5,936,266 A    8/1999  Holonyak, Jr. et al.
6,369,403 B1   4/2002  Holonyak, Jr.
(Continued)

FOREIGN PATENT DOCUMENTS

DE         102 44 200 A1    4/2004
DE    10 2007 032 555 A1    1/2009
(Continued)

OTHER PUBLICATIONS

Streubel et al., "High Brightness AlGaInP Light-Emitting Diodes," IEEE J. on Selected Topics In Quantum Electronics, vol. 8, No. 2, pp. 321-332 (Mar. 4, 2002).

(Continued)

*Primary Examiner* — Igwe U Anya
(74) *Attorney, Agent, or Firm* — Muncy, Geissler, Olds & Lowe, P.C.

(57) ABSTRACT

A light-emitting diode having a stack-like structure, whereby the stack-like structure comprises a substrate layer and a mirror layer and an n-doped bottom cladding layer and an active layer, producing electromagnetic radiation, and a p-doped top cladding layer and an n-doped current spreading layer, and the aforementioned layers are arranged in the indicated sequence. The active layer comprises a quantum well structure. A tunnel diode is situated between the top cladding layer and the current spreading layer, whereby the current spreading layer is formed predominantly of an n-doped Ga-containing layer, having a Ga content >1%.

19 Claims, 3 Drawing Sheets

(51) Int. Cl.
*H01L 33/08* (2010.01)
*H01L 33/30* (2010.01)
*H01L 33/40* (2010.01)
*H01L 33/62* (2010.01)
*H01L 33/04* (2010.01)
*H01L 33/02* (2010.01)

(56) References Cited

U.S. PATENT DOCUMENTS

| | | | |
|---|---|---|---|
| 6,420,732 B1 * | 7/2002 | Kung | H01L 33/145 |
| | | | 257/79 |
| 6,906,353 B1 * | 6/2005 | Shieh | H01S 5/18308 |
| | | | 257/94 |
| 7,115,907 B2 | 10/2006 | Baur et al. | |
| 7,649,193 B2 | 1/2010 | Wirth | |
| 7,994,519 B2 | 8/2011 | Fehrer et al. | |
| 8,283,238 B2 | 10/2012 | Shimomura et al. | |
| 8,946,761 B2 | 2/2015 | Eissler et al. | |
| 2005/0062049 A1 * | 3/2005 | Lin | H01L 27/153 |
| | | | 257/79 |
| 2007/0029541 A1 | 2/2007 | Xin et al. | |
| 2008/0258133 A1 * | 10/2008 | Seong | H01L 33/04 |
| | | | 257/14 |
| 2010/0032648 A1 * | 2/2010 | Lu | H01L 33/04 |
| | | | 257/13 |
| 2013/0126919 A1 * | 5/2013 | Yamasaki | H01L 33/38 |
| | | | 257/94 |
| 2013/0270514 A1 | 10/2013 | Saxler | |
| 2015/0053920 A1 * | 2/2015 | Yeh | H01L 33/14 |
| | | | 257/13 |
| 2015/0187991 A1 * | 7/2015 | McGroddy | H01L 27/016 |
| | | | 257/13 |

FOREIGN PATENT DOCUMENTS

| | | |
|---|---|---|
| DE | 10 2010 032 497 A1 | 2/2012 |
| EP | 1 906 460 A2 | 4/2008 |
| EP | 2 015 372 A2 | 1/2009 |
| JP | 2008-085337 A | 4/2008 |
| JP | 2009-033137 A | 2/2009 |

OTHER PUBLICATIONS

Partial Korean Office Action for Korean Application No. 10-2017-0065302 dated Jun. 12, 2018—English translation.

* cited by examiner

LIGHT-EMITTING DIODE

This nonprovisional application claims priority under 35 U.S.C. § 119(a) to German Patent Application No. 10 2016 006 295.9, which was filed in Germany on May 27, 2016, and which is herein incorporated by reference.

BACKGROUND OF THE INVENTION

Field of the Invention

The invention relates to a light-emitting diode.

Description of the Background Art

Various LED structures are known from DE 102 44 200 A1 (which corresponds to U.S. Pat. No. 7,115,907), DE 10 2010 032 497 A1 (which corresponds to U.S. Pat. No. 8,946,761), and from K. Streubel, et al., "High Brightness AlGaInP Light-Emitting Diodes," IEEE Journal on Selected Topics in Quantum Electronics, Vol. 8, No. 2 March/April 2002.

SUMMARY OF THE INVENTION

It is therefore an object of the invention to provide a device that refines the prior art.

According to an exemplary embodiment of the invention, a light-emitting diode having a stack-like structure is provided, whereby the stack-like structure comprises a substrate layer and a mirror layer and an n-doped bottom cladding layer and an active layer, producing electromagnetic radiation, and a p-doped top cladding layer and an n-doped current spreading layer, and the aforementioned layers are arranged in the indicated sequence.

The active layer comprises a quantum well structure. A tunnel diode is situated between the top cladding layer and the current spreading layer, whereby the current spreading layer is formed substantially of an n-doped Ga-containing layer, having a Ga content >1%.

It should be noted that the percentages in the case of elements such as, for example, Ga or Al or In, indicate the ratio of the number of atoms of group III elements in the chemical compound of the particular layer. Thus, the specification $Al_{0.1}Ga_{0.9}As$ indicates a layer made of a semiconductor material in which 50% of the atoms are group V elements (As) and 50% of the atoms are group III elements, whereby 10% of the group III elements in turn is formed by Al atoms and 90% by Ga atoms. The nomenclature is used analogously in the case of mixtures of group V elements in semiconductor materials such as $GaAs_{0.8}P_{0.2}$.

The term "stack-like structure" can comprise semiconductor layers arranged one on top of another. Preferably, the layers are formed monolithically beginning from the N-cladding layer up to and including the N-contact layer and are produced in particular by MOVPE epitaxy. Depending on the production, the monolithically formed layers can also be bonded to a substrate layer.

The other layers, overlying the active layer, including the layers of the tunnel diode, can be formed as transparent as possible for the emission wavelength of the active layer.

An advantage of the present structure is that the light yield can be increased in a simple and cost-effective manner, whereas the polarity of the structure in which the p-region is located above the active layer can be retained. Conventional LEDs with a p-region above the active zone have very low light yields. A higher light output can be achieved only with thin-film LEDs with an integrated metal mirror. These nevertheless always have a p-region below the active layer. The phrase "below the active layer" here always means a layer that lies on the side facing away in regard to the light outcoupling, and the phrase "above the active layer" means a layer that lies on the side facing the light outcoupling side. A p-region above the active zone can be achieved in these components only by a laborious and cost-intensive additional bonding process and an additional auxiliary substrate material. A higher light output, in which the absorption losses in the n-current spreading layer are smaller and the transverse conductivity of the n-current spreading layer is greater than in the case of a corresponding p-polarity, can be achieved in a simple and economic manner with the present structure with a tunnel diode above the active layer and a polarity reversal. It emerged surprisingly that despite the incorporation of the tunnel diode and the polarity reversal of the layers on the active layer, the light output is at least comparable in comparison with a prior-art layer sequence with an N-cladding layer between the active layer and the N-current spreading layer but has an advantageous polarity of the total structure. Furthermore, the advantage of the substantially lower contact resistance of an n-contact layer in comparison with a p-contact layer is retained.

Stated differently, a mirror layer for increasing the efficiency is being used so far only in high-power LEDs for reasons of cost. The skilled artisan is thus then always left with the n-up structure, i.e., without the incorporation of a tunnel diode, in order to obtain the necessary transverse conductivity due to the lower effective mass of electrons in the n layers.

High current densities in the case of high-power p-up LEDs, however, always require a transparent and highly electrically conductive tunnel diode. Surprisingly, a tunnel diode of this kind can be formed in a simple and cost-effective manner particularly with arsenide and phosphide layers doped with tellurium and carbon.

A further advantage is that the high-power p-up LEDs can be easily replaced by the current "standard" p-up LEDs without a total redesign being necessary.

In an embodiment, a contact layer can be formed on the current spreading layer, whereby the current spreading layer has the same polarity in the doping as the contact layer. Preferably, the doping of the contact layer is greater than the doping of the current spreading layer.

In an embodiment, the stack-like structure can comprise predominantly monolithically arranged layers, whereby part of the layers contain group-III-arsenide compound semiconductors and/or group-III-phosphide compound semiconductors.

In an embodiment, the active layer can have an emission wavelength greater than 600 nm or greater than 700 nm.

In an embodiment, the substrate layer can comprise or be formed of silicon or germanium or nickel or GaAs. The substrate layer on the bottom side can have a first terminal contact over its entire surface. In an embodiment, an n-doped contact layer can be formed below the n-doped bottom cladding layer.

In an embodiment, the mirror layer comprises or is formed of a metal layer. In this regard, the metal layer forms an electrical contact between the substrate and the bottom cladding layer and/or the n-doped bottom contact layer. In a further embodiment, the mirror layer can comprise a semiconductor mirror.

In an embodiment, the bottom cladding layer and the top cladding layer can be formed of compounds having GaAs or of AlGaAs or of InGaAsP or of GaAsP or of InGaP or of AlInGaP.

In an embodiment, the quantum well structure can comprise a multi-quantum well structure, whereby the multi-quantum well structure can have a thickness between 15 nm and 350 nm or a thickness between 30 nm and 300 nm. In an embodiment, the active layer has an $In_xGa_{1-x}As/GaAs_{1-y}P_y$ multi-quantum well structure with $0.1 \leq x \leq 0.2$ and $0.1 \leq y \leq 0.3$ or of an $Al_xGa_{1-x}As/Al_yGa_{1-y}As$ multi-quantum well structure with $0 \leq x \leq 0.25$ and $0.2 \leq y \leq 0.85$.

In an embodiment, the n-doped current spreading layer can have a thickness between of 0.1 μm to 5.0 μm. Preferably, the current spreading layer is formed of a GaAs or AlGaAs or InGaP or InAlP or AlInGaP compound. In particular, the current spreading layer comprises an n-doped $Al_xGa_{1-x}As$ layer having an Al-content x between 0% and 20%. In an embodiment, the current spreading layer can have an n-dopant concentration greater than $1.0E18$ N/cm$^3$. It is advantageous, if the current spreading layer has a layer resistance Rs<70Ω/■ and the cladding layer has a layer resistance Rs>400Ω/■.

In an embodiment, the tunnel diode comprises an As-containing layer, the As-containing layer being doped with carbon, and/or a P-containing layer. The P-containing layer of the tunnel diode can be doped with tellurium. The tunnel diode can comprise an n-doped layer having a dopant concentration greater than $3 \times 10^{18}$ N/cm$^3$ and a p-doped layer having a dopant concentration greater than $1 \times 10^{19}$ N/cm$^3$.

In an embodiment, the current spreading layer has a recess, whereby the recess comprises a top-side edge surface and a side surface and a bottom surface and whereby the current spreading layer is completely removed on the bottom surface and the bottom surface is covered with a filler material that is different from the first semiconductor material, and the contact resistance between the filler material and the bottom surface is greater than the contact resistance between the filler material and the current spreading layer. The recess is filled predominantly or preferably completely with the filler material. The filler material is part of the front side contact and has a metallic conductivity at least on the top side.

In an embodiment, the edge region and/or the side surface can be covered at least partially or completely with the filler material. The recess is preferably filled completely with the filler material. The filler material preferably contains Au and/or Ni and/or Pd and/or Pt and/or Ag.

In an embodiment, the filler material can comprise a metallic compound, whereby the metallic compound on the bottom surface produces at least a 10-times higher contact resistance than in regard to the side surface and/or the edge surface.

In an embodiment, a chemical compound or an alloy or an intermediate semiconductor layer can be formed at the boundaries between the filler material and the layers surrounding the filler material.

It is advantageous if the filler material contains a dopant for doping the boundaries with the surrounding layers. In this regard, the dopant diffuses out of the filler material into the adjacent layers. The filler material can have a dopant with the polarity of the dopant of the current spreading layer.

In an embodiment, the filler material and/or the current spreading layer and the contact layer have a doping with one or more of the elements Si, Ge, and Te. In an embodiment, a Schottky contact is formed in the area of the bottom.

In an embodiment, the recess does not penetrate the tunnel diode layer structure or penetrates it partially or completely. For example, at least part of the bottom surface of the recess can be formed in the area of the top cladding layer.

In an embodiment, the recess can be formed circular or oval or angular, whereby the area of the recess is at most 25% of the area of the active layer.

The recess in the current spreading layer can be situated in the vicinity of the layer's centroid. It is most preferable if the recess comprises the centroid; i.e., the recess is formed in the middle of the surface. Stated differently, the recess is situated centrally or eccentrically on the surface of the light-emitting diode. In an embodiment, a second terminal contact in the form of a bond, preferably in the form of a wire bond, is formed on the surface of the filler material within the recess.

In an embodiment, proceeding from the recess, a plurality of electrically conductive fingers are situated on the surface of the light-emitting diode, whereby the fingers are electrically connected to the second terminal contact.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
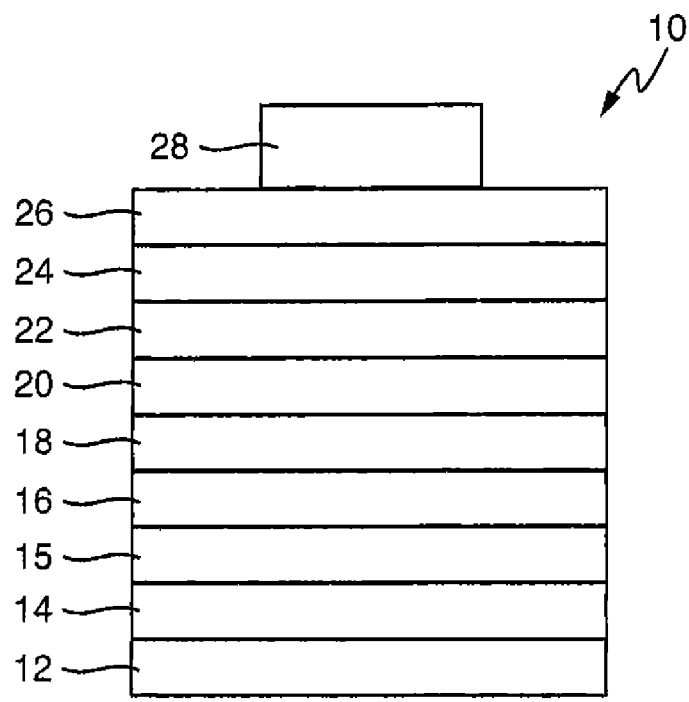
FIG. 1 shows a view of an embodiment of the invention of an LED layer stack.

The illustration in FIG. 1 shows a view of an embodiment of the invention of a light-emitting diode 10. Light-emitting diode 10 has a stack-like structure with layers arranged vertically on one another. A substrate layer 14 is formed on a back-side contact layer 12. A mirror layer 15 is placed on substrate layer 14. An n-doped bottom cladding layer 16 is formed on mirror layer 15. Mirror layer 15 is preferably made from a metal layer. The metal layer forms a good electrical contact between substrate layer 14 and bottom cladding layer 16 or an n-doped contact layer (not shown), which is located below bottom cladding layer 16.

An active layer 18 producing electromagnetic radiation is placed on bottom cladding layer 16, whereby active layer 18 comprises a quantum well structure. A p-doped top cladding layer 20 is formed on active layer 18. A tunnel diode 22 is placed on top cladding layer 20. An n-doped current spreading layer 24 is formed on tunnel diode 22. An n-doped contact layer 26 is placed on n-doped current spreading layer 24. Current spreading layer 24 predominantly has an n-doped Ga-containing layer having a Ga content greater than 1%.

A front-side contact 28 is placed on n-doped contact layer 26. It is understood that front-side contact 28, in contrast to back-side contact layer 12, is not formed over the entire surface. It should also be noted that the indicated layers are arranged in the aforementioned sequence.

Figure 2:
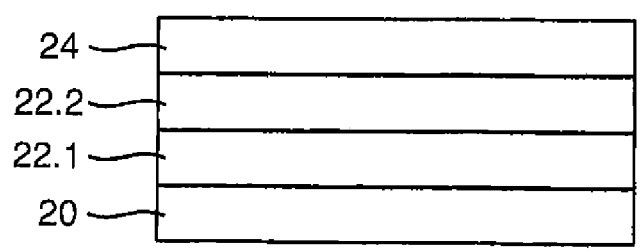
FIG. 2 shows a detailed view of the tunnel diode of the embodiment in FIG. 1.

A detailed view of the tunnel diode of the embodiment in FIG. 1 is shown in the illustration in FIG. 2. Only the differences relative to the illustration in FIG. 1 will be described below. Tunnel diode 22 has a first p-doped layer 22.1 placed on top cladding layer 20. The doping of the first layer is greater than $1\times10^{19}$ N/cm$^3$. The first layer preferably comprises As, the first layer being doped with carbon.

A second n-doped layer 22.2 is placed on first layer 22.1. The doping of the second layer is greater than $3\times10^{18}$ N/cm$^3$. The second layer preferably comprises P, the second layer being doped with tellurium.

Figure 3:
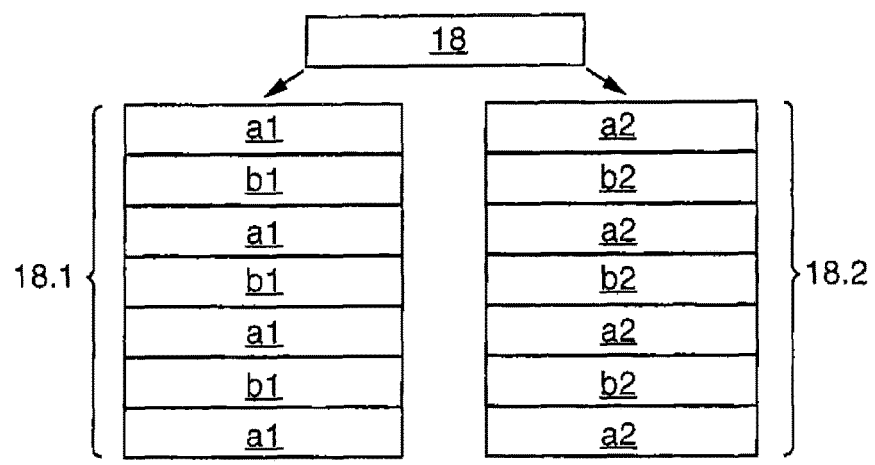
FIG. 3 shows a detailed view of the structure of the active layer of the embodiment in FIG. 1.

A detailed view of active layer 18 of the embodiment in FIG. 1 is shown in the illustration in FIG. 3. Only the differences relative to the illustration in FIG. 1 will be described below. In a first alternative, a first layer stack 18.1, formed as multi-quantum well structure, and in a second alternative a second layer stack 18.2, also formed as a multi-quantum well structure, are shown for the active layer.

First layer stack 18.1 has a sequence of a first layer a1 and a second layer b1. The sequence in the present case repeats exactly three times. First layer a1 is arranged as the topmost layer of first layer stack 18.1. First layer a1 is 20 nm thick and has a $GaAs_{0.8}P_{0.2}$ compound. Second layer b1 is 10 nm thick and has an $In_{0.15}Ga_{0.85}As$ compound.

Second layer stack 18.2 has a sequence of a first layer a2 and a second layer b2. The sequence in the present case repeats exactly three times. First layer a2 is arranged as the topmost layer of second layer stack 18.2. First layer a2 is 20 nm thick and has an $Al_{0.5}Ga_{0.5}As$ compound. Second layer b2 is 10 nm thick and has an $Al_{0.15}Ga_{0.85}As$ compound.

Figure 4:
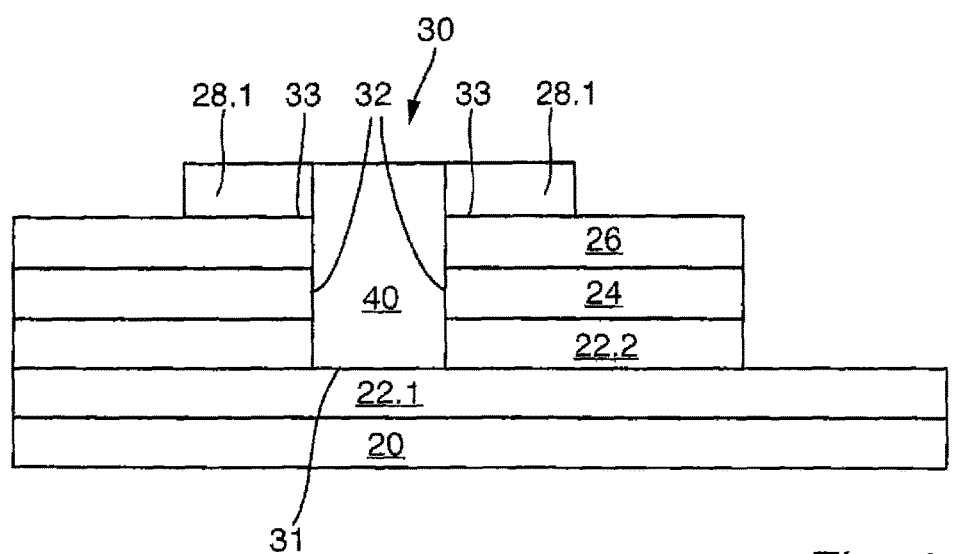
FIG. 4 shows a detailed view of the embodiment in FIG. 1 with an embodiment of a recess.

A detailed view of a first embodiment of a recess for the embodiment in FIG. 1 is shown in the illustration of FIG. 4. Only the differences relative to the illustration in FIG. 1 will be described below.

A top part of the stack-like monolithic structure of light-emitting diode 10 has a circular or oval or rectangular recess 30 with a bottom 31, with a side surface 32, and a top-side edge surface 33. Recess 30 is situated in the center of the surface (not shown) of n-doped contact layer 26 and completely penetrates n-doped contact layer 26 and subjacent n-doped current spreading layer 24 and second layer 22.2 of tunnel diode 22 and in FIG. 4 lies above first layer 22.1 of tunnel diode 22. It is understood that depending on the duration and type of the etching or structuring process, bottom 31 of recess 30 is formed with a different depth in first layer 22.1.

The area of the recess constitutes at most 25% of the area of the active layer. Otherwise, the light-emitting area of n-doped contact layer 26 becomes too small.

Figure 5:
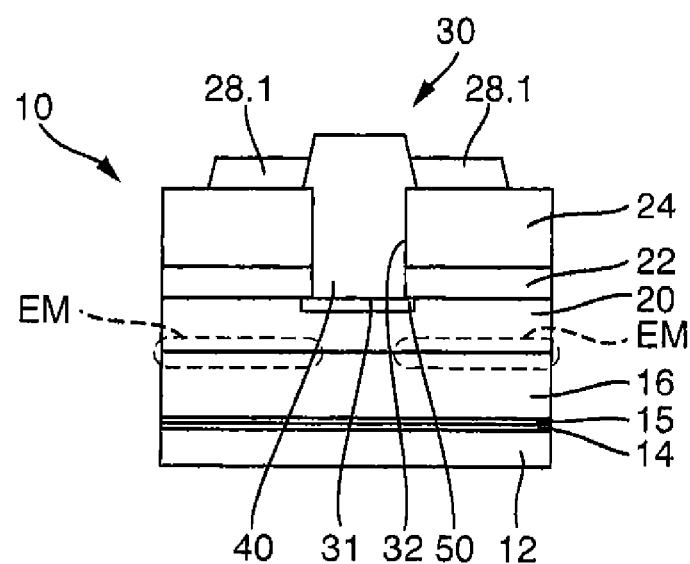
FIG. 5 shows a complete view of the embodiment in FIG. 1 with a recess and an illustration of the preferred emission ranges in the case of the active layer.

It is understood that in a further embodiment, shown in FIG. 5, bottom 31 of recess 30 is formed at or within top cladding layer 20, whereby depending on the duration and type of dry etching process, bottom 31 of recess 30 is situated with a different depth in top cladding layer 20.

Recess 30 is filled with a filler material 40 different in comparison with the surrounding semiconductor material of layers 20, 22.1, 22.2, 24, 26. Filler material 40 preferably comprises Au and/or Ni and/or Pd and/or Pt and/or Ag.

Recess 30 is filled predominantly or preferably completely with filler material 40. Filler material 40 represents part of front side contact 28 and has a metallic conductivity at least on the top side. The contact resistance between filler material 40 and bottom 31 is at least 10 times higher than the contact resistance between filler material 40 and current spreading layer 24. An undesirable current flow through bottom 31 is suppressed perpendicular to active layer 18.

The contact resistance between filler material 40 and bottom surface 31 is preferably greater than that to layers 22.2, 24, 26 opened on the side surfaces.

In an embodiment that is not shown, an insulation layer is formed in the area of bottom 31 and/or on side surfaces 32. The insulation layer can be formed, for example, before the introduction of filler material 40. A further possibility is that the semiconductor/cladding layer itself forms an insulation layer by the outward diffusion of a dopant out of the filler material.

Filler material 40 contains a dopant for doping boundaries 31 and 32 between the filler material. Filler material 40 has one or more the elements Si, Ge, and Te as the dopant. Filler material 40 in an embodiment that is not shown has a Schottky contact in the area of bottom 31.

Metal traces are formed in the shape of fingers 28.1 on top-side edge surface 33 as part of front-side contact 28 in order to connect n-doped contact layer 26 to the surface with as low a resistance as possible. All fingers 28.1 are connected in a low-resistance manner to filler material 40. In an embodiment that is also not shown, a wire bond is formed on the top side of the filler material as part of a second terminal contact.

A view of the embodiment in FIG. 1 with a second embodiment of the recess with an illustration of the preferred emission ranges in the case of the active layer is shown in the illustration in FIG. 5. Only the differences relative to the embodiment shown in FIG. 4 will be described below.

Because current spreading layer 24 already has a good electrical conductivity and a low contact resistance to the top second terminal contact, the formation of n-doped contact layer 26 is unnecessary. An advantage is that the emission rate of light-emitting diode 10 increases.

Bottom 31 of recess 30 is formed at or within top cladding layer 20. In the area of bottom 3, a Schottky contact area 50 is formed, by which a current flow vertical to active layer 18 is effectively suppressed.

Substrate layer 14 is made very thin and has a thickness between 100 µm to 450 µm. Filler material 40 comprises a PdGe compound.

Two emission regions EM of active layer 18 are shown to the left and right next to the bottom area. In a view that is not shown, the emission regions are formed completely encircling recess 30.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A light-emitting diode having a stack-like structure, the light-emitting diode comprising:
a substrate layer;
an n-doped bottom cladding layer;

an active layer producing electromagnetic radiation, the active layer comprising a quantum well structure;
a p-doped top cladding layer;
an n-doped current spreading layer; and
a tunnel diode arranged between the top cladding layer and the current spreading layer, the current spreading layer having an n-doped Ga-containing layer having a Ga content >1%;
a mirror layer arranged between the substrate layer and the n-doped cladding layer;
an n-doped contact layer formed below the n-doped bottom cladding layer,
wherein the tunnel diode comprises an As-containing layer that is doped with carbon and/or comprises a P-containing layer that is doped with tellurium,
wherein the tunnel diode comprises an n-doped layer having a dopant concentration greater than $3 \times 10^{18}$ N/cm$^3$ and a p-doped layer having a dopant concentration greater than $1 \times 10^{19}$ N/cm$^3$,
wherein the current spreading layer has a recess,
wherein the recess has a top-side edge surface, a side surface and a bottom surface,
wherein the current spreading layer is completely removed on the bottom surface and the bottom surface is covered with a filler material that is different from an adjacent semiconductor material, and
wherein a contact resistance between the filler material and the bottom surface is greater than a contact resistance between the filler material and the current spreading layer.

2. The light-emitting diode according to claim 1, wherein a contact layer is formed on the current spreading layer and the current spreading layer has a same polarity in the doping as the contact layer, and wherein the n-doping of the contact layer is greater than the n-doping of the current spreading layer.

3. The light-emitting diode according to claim 1, wherein the stack-like structure comprises monolithically arranged layers and part of the layers contain group-III-arsenide compound semiconductors and/or group-III-phosphide compound semiconductors.

4. The light-emitting diode according to claim 1, wherein the substrate layer comprises silicon or germanium or nickel or GaAs and has a first terminal contact.

5. The light-emitting diode according to claim 1, wherein the mirror layer is formed from a metal layer and the metal layer forms an electrical contact between the substrate and the bottom cladding layer and/or the bottom contact layer.

6. The light-emitting diode according to claim 1, wherein the bottom cladding layer and the top cladding layer comprise a compound of GaAs or of AlGaAs or of InGaAsP or of GaAsP or of InGaP or of AlInGaP.

7. The light-emitting diode according to claim 1, wherein the current spreading layer has a thickness between of 0.1 µm to 5.0 µm.

8. The light-emitting diode according to claim 1, wherein the current spreading layer is n-doped and is formed of GaAs or AlGaAs or InGaP or InAlP or AlInGaP.

9. The light-emitting diode according to claim 1, wherein the current spreading layer comprises an n-doped $Al_xGa_{1-x}As$ layer having an Al-content x between 0% and 20%.

10. The light-emitting diode according to claim 1, wherein the current spreading layer has a layer resistance $R_s<70\Omega/\blacksquare$ and the cladding layer has a layer resistance $R_s>400\Omega/\blacksquare$.

11. The light-emitting diode according to claim 1, wherein the filler material comprises a metallic compound, and wherein the metallic compound in an area of the bottom surface produces at least a 10-times higher contact resistance than with respect to the side surface and/or to the edge surface.

12. The light-emitting diode according to claim 11, wherein a Schottky contact is formed in the area of the bottom surface.

13. The light-emitting diode according to claim 1, wherein a chemical compound or an alloy or an intermediate semiconductor layer is formed at boundaries between the filler material and the layers surrounding the filler material.

14. The light-emitting diode according to claim 13, wherein the filler material contains a dopant for doping the boundaries with the surrounding layers.

15. The light-emitting diode according to claim 1, wherein the filler material and/or the current spreading layer and the contact layer have a doping with one or more of the elements Si, Ge, and/or Te.

16. The light-emitting diode according to claim 1, wherein the recess does not penetrate the tunnel diode layer or penetrates it partially or completely.

17. The light-emitting diode according to claim 1, wherein at least part of the bottom surface is formed in the area of the top cladding layer.

18. The light-emitting diode according to claim 1, wherein the recess is arranged centrally or eccentrically on a surface of the light-emitting diode, and wherein a second terminal contact is formed on a surface of the filler material within the recess in the form of a bond.

19. The light-emitting diode according to claim 18, wherein proceeding from the recess, a plurality of electrically conductive fingers are situated on the surface of the light-emitting diode, and wherein the fingers are electrically connected to the second terminal contact.

* * * * *